United States Patent
Kubo et al.

[11] Patent Number: 6,021,964
[45] Date of Patent: Feb. 8, 2000

[54] GAS INTRODUCTION PIPE AND MAGNETIC RECORDING MEDIUM PRODUCTION METHOD USING THE PIPE

[75] Inventors: Tomohiro Kubo; Shuetsu Kumagai, both of Miyagi, Japan

[73] Assignee: Sony Corporation, Tokyo, Japan

[21] Appl. No.: 09/103,707

[22] Filed: Jun. 24, 1998

[30] Foreign Application Priority Data

Jun. 25, 1997 [JP] Japan ................................... 9-169196

[51] Int. Cl.⁷ ...................................................... B05B 1/00
[52] U.S. Cl. ......................... 239/600; 427/129; 427/531
[58] Field of Search .................................. 239/135, 589, 239/596, 600; 427/129, 523, 531, 532

[56] References Cited

U.S. PATENT DOCUMENTS

| | | | |
|---|---|---|---|
| 4,545,317 | 10/1985 | Richter et al. | 239/589 |
| 5,569,494 | 10/1996 | Suzuki et al. | 427/129 |
| 5,585,139 | 12/1996 | Steininger | 427/129 |
| 5,691,008 | 11/1997 | Thoma et al. | 427/531 |

*Primary Examiner*—Andres Kashnikow
*Assistant Examiner*—Lisa Ann Douglas
*Attorney, Agent, or Firm*—Hill & Simpson

[57] ABSTRACT

The present invention provides a gas introduction pipe in which the least component is replaced when deformation or damage is caused and a magnetic recording medium production method using this gas introduction pipe. The gas introduction pipe according to the present invention includes: a gas supply pipe 20 for supplying a gas; a main body 22, 23 connected to the gas supply pipe and having a gas flow passage 21 for flowing of a gas supplied from the gas supply pipe; and a blowoff block 25 arranged at the opposite side of the main body 22, 23 not having the gas supply pipe and having a blowoff opening 27 exposed outward for blowing off the gas outside. The blowoff block 25 is held so as to be sandwiched by the main body 22, 23 and can be detached and attached from/to the main body 22, 23.

4 Claims, 12 Drawing Sheets

GAS INTRODUCTION PIPE AND MAGNETIC RECORDING MEDIUM PRODUCTION METHOD USING THE PIPE

BACKGROUND OF THE INVENTION

1. Field of the Invention

The present invention relates to a gas introduction pipe which can preferably used for a deposition apparatus or the like, and to magnetic recording medium production method in which oxygen gas is blown out by using the gas introduction pipe so as to form a magnetic layer.

2. Description of the Prior Art

For example, in the field of video tape recorder, in order to obtain a high quality image, there is a strong request for a higher recording density. As a magnetic recording medium to answer this request, there has been proposed a so-called metal magnetic thin film type magnetic recording medium having a magnetic layer formed by applying a metal magnetic material directly onto a non-magnetic support body by way of plating and vacuum thin film formation technique (vacuum deposition, sputtering, ion plating method, and the like).

This metal magnetic thin film type magnetic recording medium has various advantages such as an excellent coercive force, an excellent rectangular ratio, and an excellent electromagnetic conversion characteristic in a short wavelength band. Such a magnetic recording medium also enables to form the magnetic layer as a thin film with a high filling density of a magnetic material because there is not need of mixing a binder or other non-magnetic material in the magnetic layer such as in a painting-type magnetic recording medium.

Especially, a deposition-type magnetic tape (deposited magnetic tape) having a magnetic layer formed by vacuum deposition method has a high production efficiency and a stable characteristic and already used in practice.

The deposition for forming the magnetic layer in the aforementioned deposited tape is carried out by a deposition apparatus-including a vacuum chamber, a can roll for guiding a non-magnetic support body, a magnetic material as a deposition source, heating means for heating the deposition source, and the like.

In this deposition apparatus, the magnetic material serving as the deposition source is evaporated into a metal vapor by electron ray radiation or the like, so that the metal vapor is deposited to form a film on a non-magnetic support body which runs along an outer circumference of the can roll.

Here, the metal magnetic thin film thus formed has a magnetic characteristic which is affected by an incident angle of the metal particles coming onto the non-magnetic support body. In order to control the incident angle of this metal vapor, a shutter is normally provided in the vicinity of the can roll so as to cover a predetermined area of the support body.

Moreover, in order to improve the magnetic characteristic of the magnetic layer such as the coercive force and the saturation magnetic flux density, it is normally a case to use an oxygen gas introduction pipe having a slit-shaped blowoff opening along the width direction of the non-magnetic support body, so as to oxidize the metal vapor by the oxygen gas supplied from this slid. This oxygen gas introduction pipe is attached to the shutter cooled by water, so as to prevent deformation by a high temperature vapor.

FIG. 1 and FIG. 2 show an oxygen gas introduction pipe 100 including a gas supply pipe 101 for supplying an oxygen gas from outside, and a gas flow block 103 having a flow passage 102 of the oxygen gas supplied from this gas supply pipe 101. This gas flow block 103 has an upper cover 104 and an introduction pipe body 105 which are matched to each other via a predetermined clearance. The upper cover 104 and the introduction pipe body 105 are connected in this gas flow block 103 with a plurality of bolts 106.

Moreover, the introduction pipe body 105 includes a cooling circuit 107 formed therein. This cooling circuit 107 is supplied with a cooling water from a cooling water flow-in pipe 108 attached to the oxygen gas introduction pipe.

Furthermore, in this oxygen gas introduction pipe 100, a spacer (not depicted) is inserted between the upper cover 104 and the introduction pipe body 105 so as to define the clearance between the upper cover 104 and the introduction pipe body 105 to be a predetermined width.

Moreover, in this oxygen gas introduction pipe 100, a blowoff opening 109 for blowing off oxygen gas is defined by the clearance between the upper cover 104 and the introduction pipe body 105. An oxygen gas port 110 is also formed as a hollow space defined by the upper cover 104 and the introduction pipe body 105 which are matched to each other.

In the deposition apparatus using the oxygen gas introduction pipe 100 having the aforementioned configuration, when forming a magnetic layer on a non-magnetic support body, oxygen gas is blown out from the oxygen gas introduction pipe 100 to the metal vapor. The metal vapor is oxidized in a predetermined quantity and accumulated on the non-magnetic support body.

By the way, the aforementioned oxygen gas introduction pipe 100 when used in a deposition apparatus for example, is subjected to a high temperature atmosphere such as about 1000 to 1200 C. For this, the oxygen gas introduction pipe 100 is provided with the cooling circuit 107 in the introduction pipe body 105. Consequently, there will hardly be caused deformation of the introduction pipe body 105 by heat.

However, this oxygen gas introduction pipe 100 is not provided with means for cooling the upper cover 104, which is often deformed by heat. Moreover, in this oxygen gas introduction pipe 100, the upper cover 104 and the introduction pipe body 105 are fixed with a plurality of bolts 106. If the upper cover 104 is deformed as has been described above, the deformation is small in the vicinity of the bolts 106 and large in the portion between the bolts 106. Thus, in the oxygen gas introduction pipe 100, the deformation occurs not in a uniform manner over the upper cover 104.

Thus, if the upper cover 104 is deformed unevenly by heat, there arises irregularities in the width of the blowoff opening 109. As a result, the oxygen gas introduction pipe 100 is disabled to blow off the oxygen gas uniformly from the blowoff opening 109.

For this, if this oxygen gas introduction pipe 100 is used for forming a metal magnetic thin film, oxidation lacks in uniformity in the width direction of the blowoff opening 109, which in turn brings about an uneven film thickness in the width direction. As a result, the metal magnetic thin film obtained has irregularities, making unstable the electromagnetic conversion characteristic.

On the other hand, when this oxygen gas introduction pipe 100 is used for a deposition apparatus, the deposition material may adhere to the vicinity of the blowoff opening 109. In such a case, the material is physically peeled off from the vicinity of the blowoff opening 109 of the oxygen gas introduction pipe 100.

In the conventional oxygen gas introduction pipe 100, the physical peeling off of the material often damages the vicinity of the blowoff opening 109. This also makes uneven the slit width of the blowoff opening 109 in the oxygen gas introduction pipe 100. As a result, it becomes impossible to blow off the oxygen gas in a uniform manner. In this case, similarly as has been described above, the oxygen gas introduction pipe 100 results in forming a metal magnetic thin film having an unstable electromagnetic conversion characteristic.

In the conventional oxygen gas introduction pipe 100, when deformation by heat or damage is caused as has been described above, the upper cover 104 and the introduction pipe body 105 should be entirely replaced with new ones. Thus, in order to maintain the oxygen gas blowoff quantity constant and uniform, the conventional oxygen gas introduction pipe 100 requires overall replacement of components.

Thus, the conventional oxygen gas introduction pipe 100 has a problem that deformation and damage caused require replacement of components, which increases the maintenance costs.

SUMMARY OF THE INVENTION

It is therefore an object of the present invention to provide a gas introduction pipe which requires replacement of less components even if deformation and damage are caused, and a magnetic recording medium production method using this gas introduction pipe.

In order to achieve the aforementioned object, the gas introduction pipe according to the present invention includes: a gas supply pipe for supplying a gas; a main body connected to the gas supply pipe and having a gas flow passage for flowing of a gas supplied from the gas supply pipe; and a blowoff block arranged at the opposite side of the main body not having the gas supply pipe and having a blowoff opening exposed outward for blowing off the gas outside, wherein the blowoff block can be detached and attached from/to the main body.

In the gas introduction pipe having the aforementioned configuration, a blowoff opening for blowing off a gas is provided in the blowoff block which is built in the main body. In this gas introduction pipe, the blowoff block can be detached and attached from/to the main body. In case a deformation or damage is caused in the blowoff opening, the blowoff block alone need be replaced.

On the other hand, the magnetic recording medium production method according to the present invention uses a gas introduction pipe including: a gas supply pipe for supplying a gas; a main body connected to the gas supply pipe and having a gas flow passage for flowing of a gas supplied from the gas supply pipe; and a blowoff block arranged at the opposite side of the main body not having the gas supply pipe and having a blowoff opening exposed outward for blowing off the gas outside, the blowoff block being able to be detached and attached from/to the main body, wherein the gas blown off from the gas introduction pipe is applied onto a non-magnetic support body where a magnetic material is deposited, so as to form a magnetic layer.

This magnetic recording medium production method uses a gas introduction pipe in which a blowoff block can be detached and attached from/to a main body. Consequently, if any deformation or damage is caused in the blowoff block, the blowoff block can easily be replaced. For this, this method enables to always use a gas introduction pipe having a constant gas blowoff quantity. Consequently, according to this method, it is possible to always form a magnetic layer having a preferable magnetic characteristic on a non-magnetic support body.

BRIEF DESCRIPTION OF THE DRAWINGS

FIG. 9A is a cross sectional view along line A—A in FIG. 8; FIG. 9B is a cross sectional view along line B—B in FIG. 8; and FIG. 9C is a cross sectional view along line C—C in FIG. 8.

DETAILED DESCRIPTION OF PREFERRED EMBODIMENTS

Description will now be directed to a gas introduction pipe according to embodiments of the present invention with reference to the attached drawings.

Figure 3:
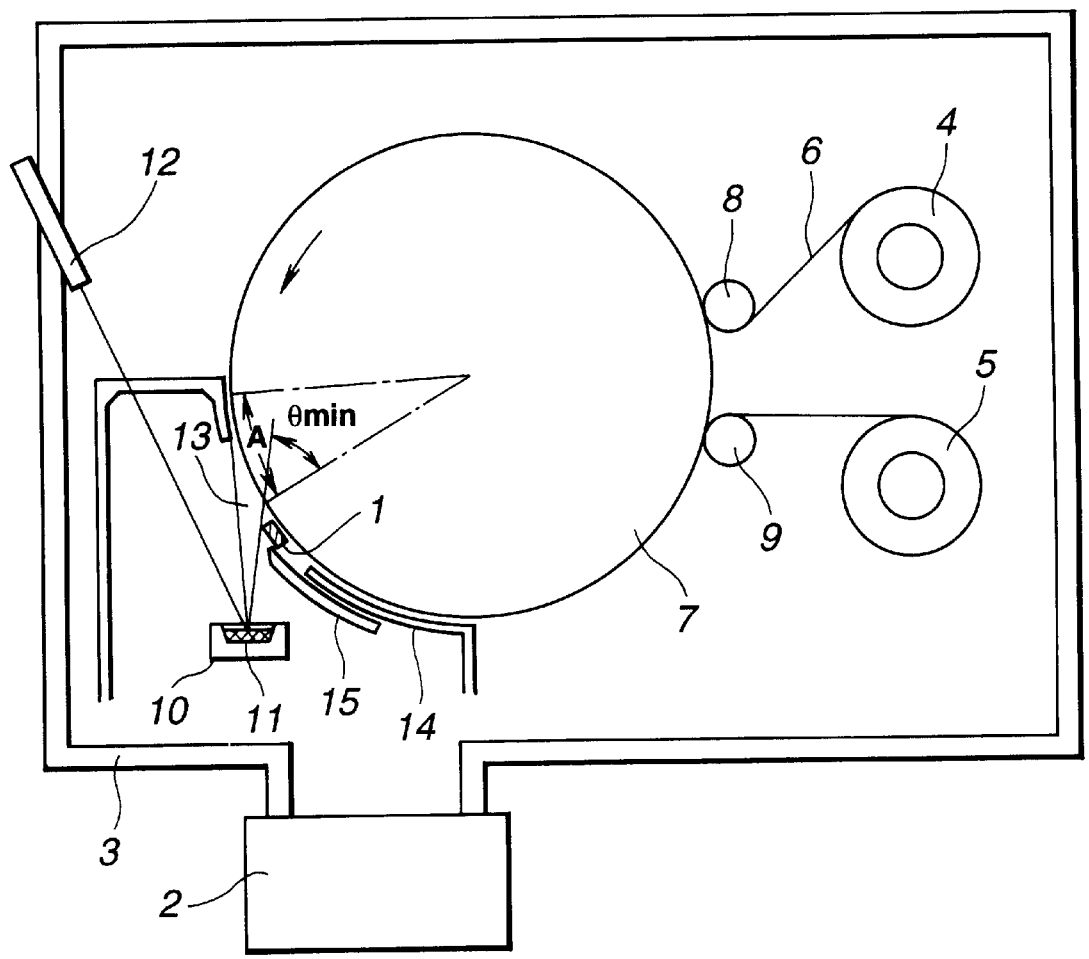
FIG. 3 schematically shows a configuration of a deposition apparatus.

The gas introduction pipe according to the present invention is applied to an oxygen gas introduction pipe 1 for blowing off an oxygen gas which is used for a deposition apparatus as shown in FIG. 3. This deposition apparatus shown in FIG. 3 is used for forming a metal magnetic thin film on a tape-shaped non-magnetic support body by way of deposition.

This deposition apparatus includes an exhauster 2; a vacuum chamber 3 which is made into a high vacuum state (about 10-3 to 10-4 Pa) by the exhauster 2; a supply roll 4 which is rotated at a constant speed couterclockwise in the figure; a wind-up roll 5 which is rotated at a constant speed clockwise in the figure. A tape-shaped non-magnetic support body 6 travels from this supply roll 4 to the wind-up roll 5.

A cooling roll (can roll) 7 having a greater diameter than the aforementioned rolls 4, 5 is provided in the middle of the travel path of the aforementioned non-magnetic support body 6 from the supply roll 4 to the wind-up roll 4. This cooling roll 7 is provided so as to pull out the non-magnetic support body 6 in the leftward direction in the figure and is rotated at a constant speed counterclockwise. It should be noted that each of the supply roll 4, the wind-up roll 5, and the cooling roll 7 has a cylindrical shape with a width almost identical to the width of the non-magnetic support body. Moreover, the cooling roll 7 includes inside a cooling apparatus (not depicted) so as to suppress deformation of the non-magnetic support body 6 due to temperature increase.

Furthermore, a guide roll 8 is provided between the supply roll 4 and the cooling roll 7, and a guide roll 9 is provided between the cooling roll 7 and the wind-up roll 5, so that a predetermined tension is applied to the non-magnetic support body 6 traveling from the supply roll 4 and via the cooling roll 7, reaching the wind-up roll 7, enabling the non-magnetic support body 6 to travel smoothly.

Moreover, the vacuum chamber 3 contains a crucible 10 provided below and left to the cooling roll 7. This crucible 10 is filled with a metal magnetic material as a deposition source 11. This crucible 10 has a width almost identical to the width of the cooling roll 7.

On the other hand, on the side wall of the vacuum chamber 1 is attached an electron gun 12 for heating and evaporating the deposition source 11 filled in the crucible 10. The electron gun 12 is provided at a position from where the electron rays emitted from the electron gun 12 are applied to the deposition source 11 in the crucible 10. The deposition source 11 is melted and evaporated into a metal vapor 13 by this electron gun 12, so that the metal vapor 13 is applied to the non-magnetic support body 6 traveling along the outer circumference of the cooling roll 7 where it is deposited to form a magnetic layer.

Moreover, in the vicinity of the cooling roll 7 is provided a protection plate 14 for preventing deposition of unnecessary metal vapor on the metal magnetic thin film formed. This protection plate 14 is arranged so as to cover a predetermined area of the non-magnetic support body 6 after a deposition area (indicated by A in the figure) for carrying out deposition on the non-magnetic support body 6.

The oxygen gas introduction pipe 1 connected to outside of the vacuum chamber 3 is attached to this protection plate 14. The oxygen gas introduction pipe 1 serves to supply an oxygen gas to the metal vapor 13. By adjusting supply quantity of this oxygen gas, it is possible to control magnetic characteristics of the metal magnetic thin film such as coercive force and saturation magnetic flux density.

Moreover, in this deposition apparatus, a drive shutter 15 is provided to partially over the protection plate 14. The drive shutter 15 prevents the metal vapor 13 from adhering to the oxygen gas introduction pipe 1 or passing through between the oxygen gas introduction pipe 1 and the protection plate 14 to adhere onto the metal magnetic thin film. This drive shutter 15 is movable in the traveling direction of the non-magnetic support body 6 and in the opposite direction.

Figure 4:
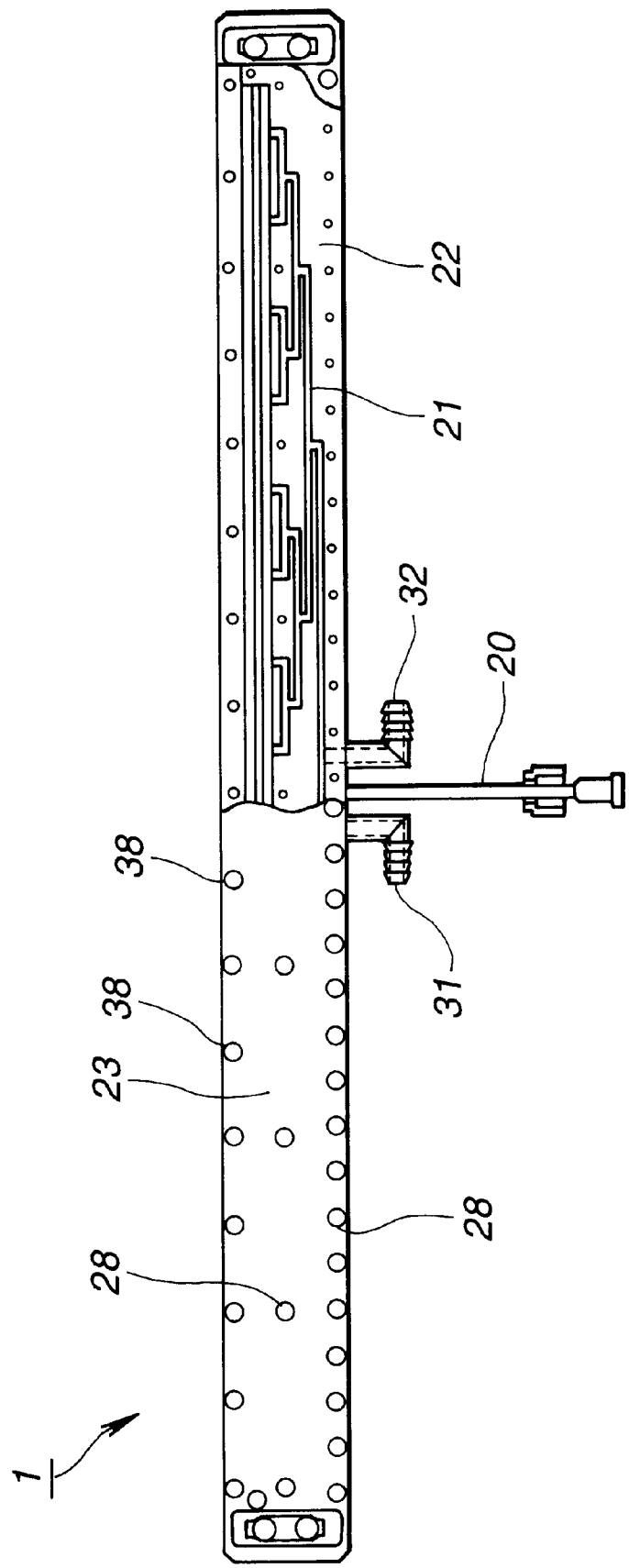
FIG. 4 is a plan view showing a gas introduction pipe according to the present invention with a half portion shown uncovered.
Figure 5:
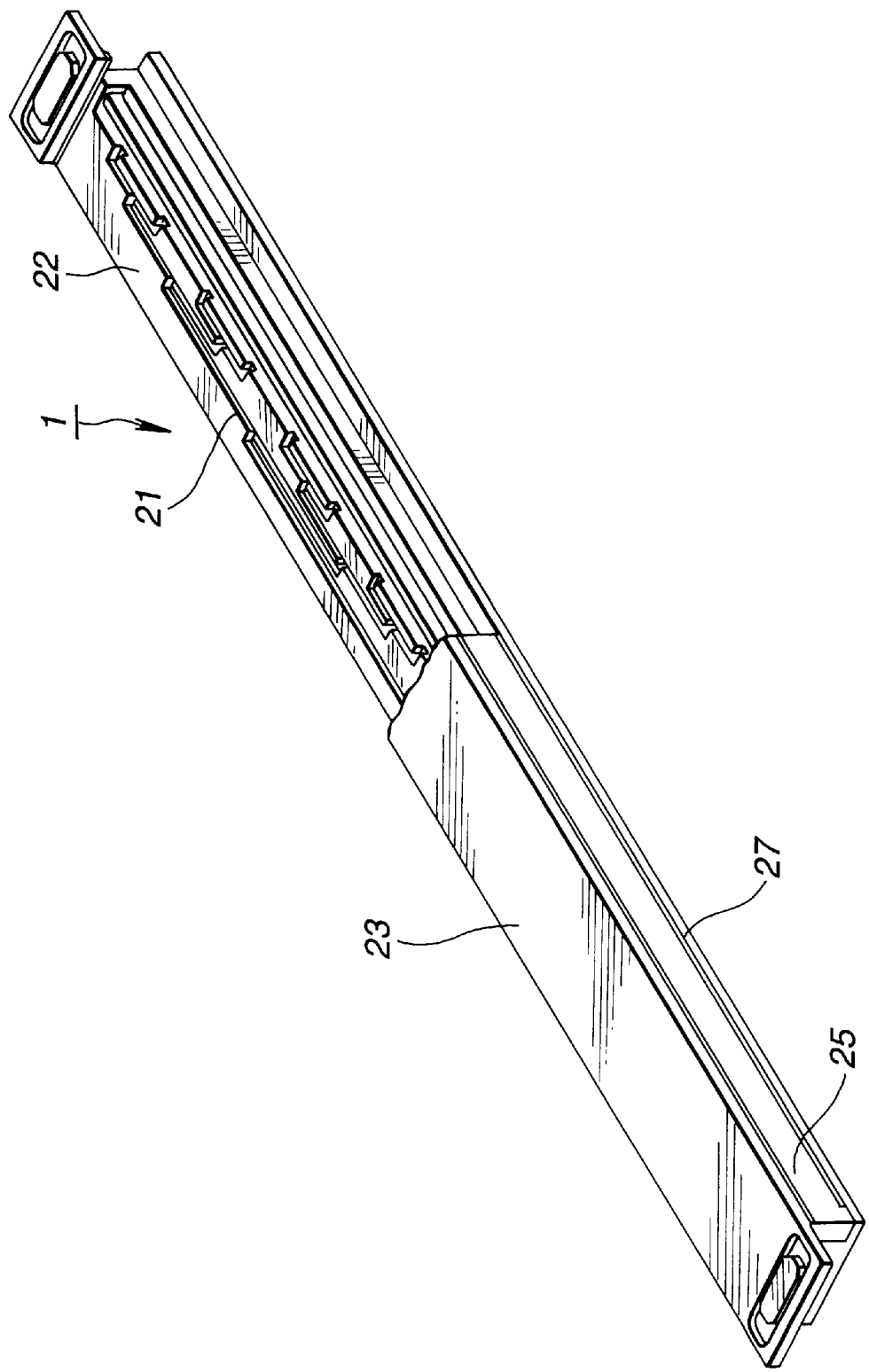
FIG. 5 is a perspective view showing a gas introduction pipe according to the present invention with a half portion shown uncovered.
Figure 6:
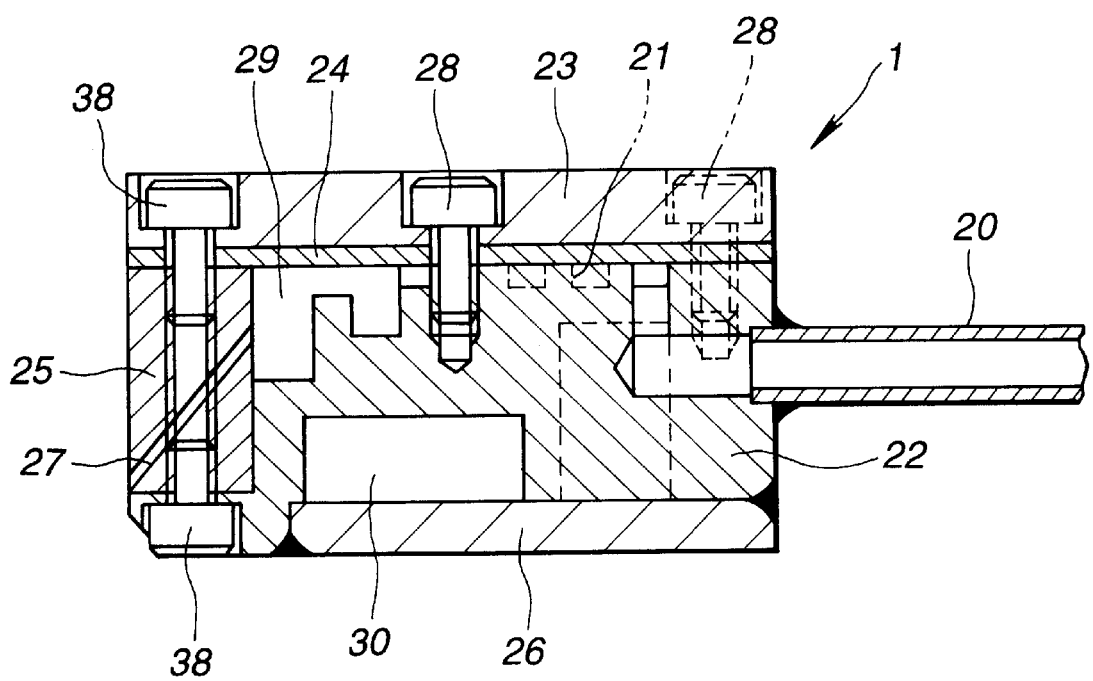
FIG. 6 is a vertical cross sectional view of the gas introduction pipe according to the present invention.

In the deposition apparatus having the aforementioned configuration, as shown in FIG. 4, FIG. 5, and FIG. 6, the oxygen gas introduction pipe 1 includes: a gas supply pipe 20 for supplying an oxygen gas; an introduction pipe lower block 22 connected to this gas supply pipe 20 and having an oxygen flow passage 21 for flowing of the oxygen gas supplied from the gas supply pipe 20; an introduction pipe upper block 23 attached to a surface of this introduction lower block 22 where the oxygen flow passage 21 is formed, and constituting an introduction pipe main body together with the introduction pipe lower block 22; a copper packing 24 arranged between the introduction lower block 22 and the introduction pipe upper block 23; and a blowoff block 25 arranged at the opposite side of the introduction pipe main body no having the gas supply pipe 20. Moreover, this oxygen gas introduction pipe 1 is provided with a heat shading plate 26 attached at the opposite side of the introduction pipe lower block 22 not having the copper packing 24.

Moreover, this oxygen gas introduction pipe 1 is formed into a parallelepiped as a whole having a blowoff opening 27 at the longitudinal direction. This blowoff opening 27 has a width almost identical to the width of the non-magnetic support body 6 onto which deposition is to be carried out, so that the oxygen gas can be blown off to the non-magnetic support body 6 evenly in the width direction.

In this oxygen gas introduction pipe 1, the introduction pipe main body, as has been described above, consists of the introduction pipe lower block 22 and the introduction pipe upper block 23 which are fixed via the copper packing 24 with a plurality of bolts 28. Inside the introduction pipe main body having this configuration, there is provided the oxygen flow passage 21. That is, the oxygen flow passage 21 is formed having a preferable air tightness by the copper packing 24 attached to the introduction pipe lower block 22.

This oxygen flow passage 21 is formed as a narrow groove passing through a plurality of branching portions and reaching the blowoff opening 27. That is, the narrow groove serving as the oxygen flow passage 21 is connected to the end of the introduction pipe main body where the gas supply pipe 20 is connected for supplying the oxygen gas from outside. The narrow groove extends in two directions along the longitudinal direction of the introduction pipe main body, each of which is bent toward the blowoff block 25 and again branched into two directions. The branched narrow groove further extends and repeats branching, so as to be branched into 16 fine tubes at the final stage.

The oxygen flow passage 21 communicates with the oxygen port 29 formed inside the introduction pipe main body. This oxygen port 29 is formed as a space extending in the longitudinal direction of the introduction pipe main body and defined by the introduction pipe lower block 22 and the introduction pipe upper block 23 which are fixed to each other, and the blowoff block 25. That is, this oxygen port 29 communicates with the 16 branches of the oxygen flow passage 21 arranged at an identical interval.

This oxygen port 29 is supplied with an oxygen gas from the oxygen flow passage 21. The oxygen gas is flown with an identical pressure in the branched passage. Consequently, through the final 16 branches, the oxygen gas is flown with an identical pressure into the oxygen port 29.

Moreover, this oxygen port 29 communicates with the blowoff opening 27. That is, the oxygen gas supplied to the oxygen port 29 is pressed toward the blowoff opening 27, so as to be blown off from the blowoff opening 27. As has been described above, the oxygen port 29 is supplied with the oxygen gas from the 16-branched oxygen flow passage 21 with an identical pressure, which blows off the oxygen gas from the blowoff opening 27 with an identical pressure over the longitudinal direction.

Furthermore, this oxygen gas introduction pipe 1 is provided with a cooling circuit 30 formed in the introduction pipe lower block 22. This cooling circuit 30 is formed as a wide groove extending over the opposite surface of the introduction pipe lower block 22 not having the oxygen flow passage 21. This cooling circuit 30 communicates with an external coolant supply apparatus (not depicted) via a coolant supply pipe 31 and a coolant exhaust pipe 32. The coolant circulates in this cooling circuit 30, so as to cool the introduction pipe lower block 22 down to a desired temperature.

Figure 7:
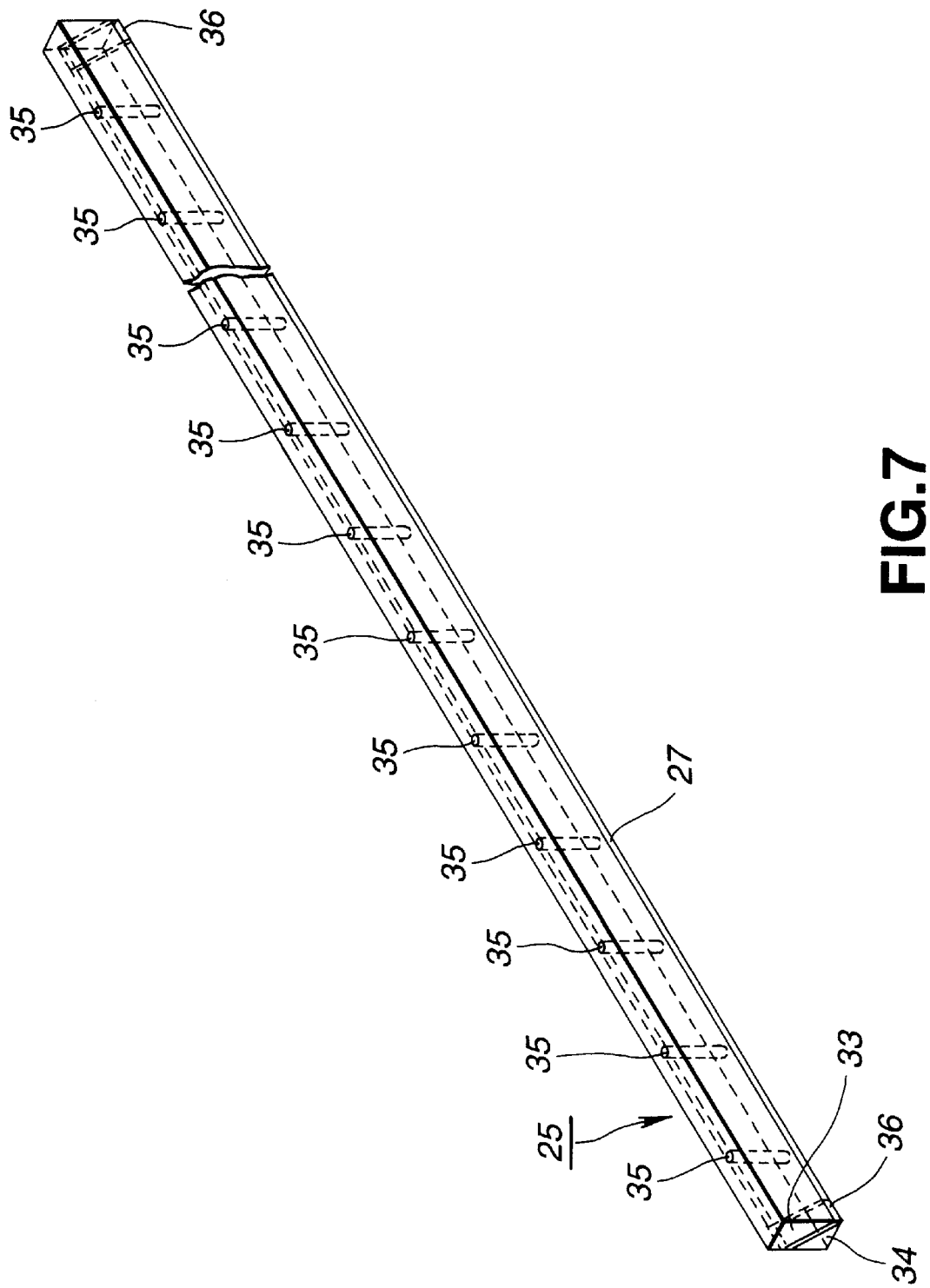
FIG. 7 is a perspective view showing a blowoff opening of the gas introduction pipe according to the present invention.
Figure 8:
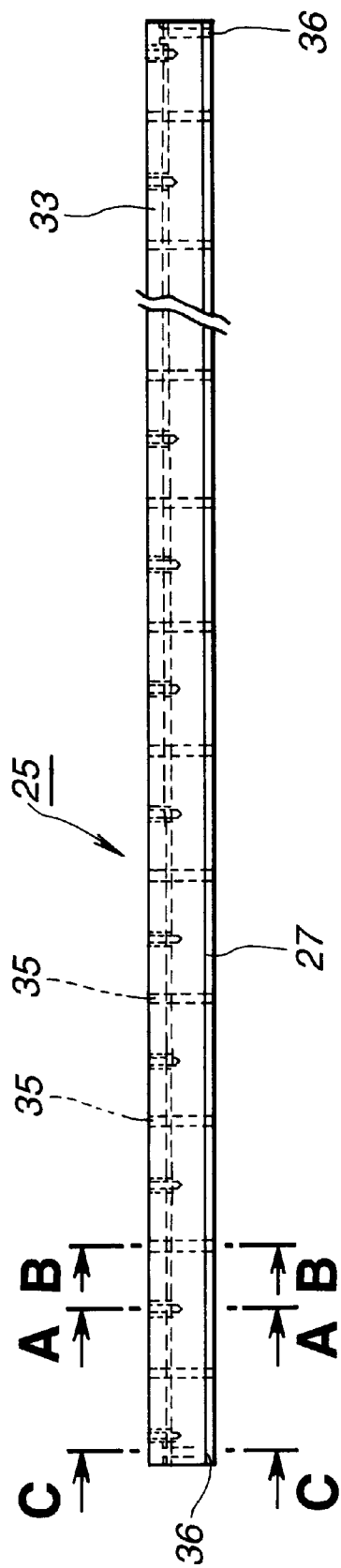
FIG. 8 is a front view of the blowoff block.

Furthermore, in this oxygen gas introduction pipe 1, as shown in FIG. 7 and FIG. 8, the blowoff block 25 includes: a first blowoff opening forming portion 33; a second blowoff opening forming portion 34; a plurality of connecting pins 35 for connecting the first blowoff opening forming portion 33 and the second blowoff opening forming portion 34; and a spacer 36 arranged at both ends of the first blowoff opening forming portion 33 combined with the second blowoff opening forming portion 34. This blowoff block 25 has a blowoff 27 defined by a predetermined interval between the first blowoff opening forming portion 33 and the second blowoff opening forming potion 34.

This blowoff block 25 has a width and a length which are almost identical to dimensions of a front portion formed by the aforementioned introduction pipe lower block 22 matched with the introduction pipe upper block 23. Thus, this blowoff block 25 is attached without any clearance to the introduction pipe lower block 22 and to the introduction block upper block 23.

Figure 9A:
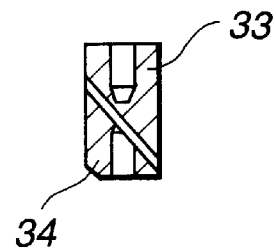
FIGS. 9A–C is a cross sectional view showing the blowoff block.
Figure 9B:
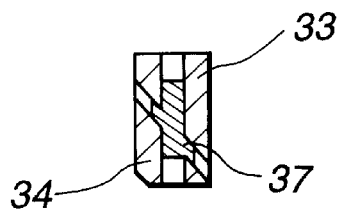
Figure 9C:
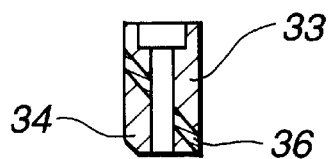

As shown in FIGS. 9A–C, each of the first blowoff opening forming portion 34 and second blowoff opening forming portion 34 is formed so as to have a slanting place of a predetermined angle. Consequently, the blowoff opening 27 is formed with a predetermined angle with respect to the front surface of the oxygen gas introduction pipe 1. More specifically, the first blowoff opening forming portion 33 and the second blowoff opening forming portion 34 are made, for example, by cutting and processing stainless steel of having almost a parallelepiped shape. This cutting process is carried out in parallel to the longitudinal direction of the stainless steel with a predetermined angle. Thus, a slanting surface is formed on each of the first blowoff opening forming portion 33 and the second blowoff opening forming portion 34.

In this case, the cutting surface obtained by the cutting process serves as the slanting surface. Consequently, when the first blowoff opening forming portion 33 is accurately matched with the second blowoff opening forming portion 34, the slanting surface formed on the first blowoff opening forming block 22 is parallel to the slanting surface formed on the second blowoff opening forming portion 34. Thus, it is possible to obtain a uniform opening defined by the two slanting surfaces in the width direction of the blowoff opening 27.

Moreover, as shown in FIG. 9C, the spacer 36 is arranged between the first blowoff opening forming portion 33 and the second blowoff opening forming portion 34, so as to obtain a predetermined value of the blowoff opening 27. This spacer 36 has a predetermined thickness and is provided at both ends of the longitudinal direction of the blowoff opening 27. Here, the thickness of the spacer 36 defines the oxygen gas introduction quantity and the introduction region and is determined according to a desired oxygen introduction quantity and a desired oxygen introduction region.

More specifically, it is preferable that the slanting surface be formed with an angle of about 50 degrees from the front surface of the blowoff block 25. Moreover, the width of the blowoff opening 27 is preferably in the range from 1.0 to 1.3 mm. In this case, the oxygen gas supply pipe 1 can preferably blow off the oxygen gas.

Furthermore, this blowoff opening 25 has the plurality of connecting pins 35 for fixing the first blowoff opening forming portion 33 together with the second blowoff opening forming portion 34. The connecting pins 35 are inserted with a pressure into holes formed in the first blowoff opening forming portion 33 and the second blowoff opening forming portion 34, so as to fix the first blowoff opening forming portion 33 to the second blowoff opening forming portion 34.

The holes for the connecting pins 35 are formed simultaneously in the first blowoff opening forming portion 33 accurately combined with the second blowoff opening forming portion 34. Here, the holes for the connecting pins 35 are formed so as to have a diameter slightly smaller than the diameter of the connecting pin 35. Consequently, when the connecting pins 35 are pressed to be inserted into the holes, the first blowoff opening forming portion 33 is fixed firmly to the second blowoff opening forming portion 34.

Figure 10:
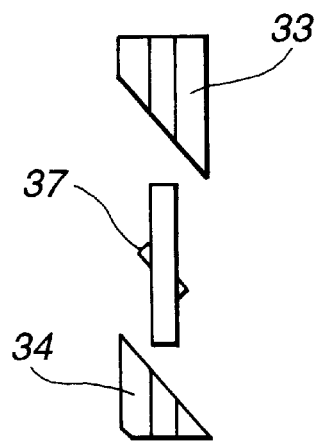
FIG. 10 is an exploded cross sectional view showing the blowoff block.

As shown in FIG. 9B and FIG. 10, the connecting pin 35 is formed into almost a cylindrical configuration and mounted so as to be sandwiched by the first blowoff opening forming portion 33 and the second blowoff opening forming portion 34. The connecting pin 35 has an auxiliary spacer 37 formed along its circumferential surface. This auxiliary spacer 37 has a thickness which is almost identical to that of the aforementioned spacer 36 and is formed on the circumferential surface of the connecting pin 35 with an angle almost identical to the aforementioned slanting surface. That is, in this blowoff block 25, the introduction pipe lower block 22 is matched with the introduction pipe upper block 23 via the spacer 36 and the auxiliary spacer 37. Consequently, the blowoff opening 27 has a uniform interval in its width direction.

It should be noted that in this oxygen gas introduction pipe 1, it is possible to adjust the oxygen gas quantity blown off from the blowoff opening 27 by changing the number of the aforementioned connecting pins 35. That is, in this oxygen gas introduction pipe 1, if it is desired to increase the blowoff quantity of the oxygen gas, the number of the connecting pins 35 is decreased. In this case also, it is preferable to arrange the connecting pins 35 at an identical interval in the width direction.

The blowoff block 25 having the aforementioned configuration is mounted with a plurality of bolts 38 to the front surface defined by the introduction pipe lower block 22 and the introduction pipe upper block 23 in combination. The plurality of bolts 38 are fastened from the side of the introduction pipe upper block 23 and from the side of the introduction pipe lower block 22.

For this, the introduction pipe lower block 22, the introduction pipe upper block 23, and the blowoff block 25 has threaded portions for the bolts 38 at corresponding position. In other words, in this oxygen gas introduction pipe 1, the blowoff block 25 can be attached and removed to/from the introduction pipe main body by means of the plurality of bolts.

The oxygen gas introduction pipe 1 having the aforementioned configuration, placed in the aforementioned deposition apparatus, blows off oxygen gas to the metal vapor 13. Inside the deposition apparatus, the temperature increases up to about 1000 to 1200 degrees and electron rays are radiated to the deposition source 11, so as to generate the metal vapor 13.

In such a deposition apparatus, the oxygen gas introduction pipe 1 is arranged in the vicinity of the splash direction of metal vapor 13. Thus, this oxygen gas introduction pipe 1 is placed under a high temperature of vapor.

However, in this oxygen gas introduction pipe 1, as has been described above, the blowoff block 25 is involved in the front surface of the introduction pipe main body. In other words, in this deposition apparatus, the blowoff block 25 is sandwiched between the introduction pipe lower block 22 and the introduction pipe upper block 23. Accordingly, deformation of the blowoff block 25 by heat is suppressed by the introduction pipe lower block 22 and the introduction pipe upper block 23.

Consequently, even when the oxygen gas introduction pipe 1 is used under a high temperature, there is no problem of deformation of the width of the blowoff opening 27, enabling to maintain a constant predetermined width of the blowoff opening 27. That is, this oxygen gas introduction pipe 1 is capable of always blowing off a predetermined oxygen gas to the metal vapor 13.

By the way, this deposition apparatus is provided with the drive shutter 15 for preventing the metal vapor 13 from adhering to the oxygen gas introduction pipe 1. However, this drive shutter 15 cannot shade the splash of the metal vapor 13 toward the oxygen gas introduction pipe 1 completely. Accordingly, in this deposition apparatus, there is a problem that a metal is accumulated on the oxygen gas introduction pipe 1 as the service time increases.

Especially, the metal accumulated in the vicinity of the blowoff opening 27 results in decreasing the width of the blowoff opening 27. In such a case, there will arise irregularities in the oxygen gas blowoff quantity from the oxygen gas introduction pipe 1, and it becomes impossible to blow off a uniform oxygen gas quantity in the longitudinal direction of the blowoff opening 27.

In the conventional oxygen gas introduction pipe, in such a case, the metal adhered is physically removed. This removal should be carried out carefully, not to scar the oxygen gas introduction pipe, taking much time. Moreover, conventionally, if the oxygen gas introduction pipe is scarred or the metal adhered cannot be removed, the oxygen gas introduction pipe should be replaced.

On the other hand, in the aforementioned oxygen gas introduction pipe 1, if the metal vapor adheres to the vicinity of the blowoff opening 27, accumulating metal, there is no need of carrying out a physical removal of the metal at a low workability. The blowoff block 25 can be replaced. In this oxygen gas introduction pipe 1, the blowoff block 27 can be removed from the introduction pipe main body and accordingly, it is possible to replace only the blowoff block 25, without replacing the introduction pipe main body.

Thus, in the oxygen gas introduction pipe 1, the metal accumulated in the vicinity of the blowoff opening 27 can be removed by replacing the blowoff block 25. This replacement can easily be carried out because the blowoff block 25 is attached to the introduction pipe main body only with the bolts 38.

Moreover, in this oxygen gas introduction pipe 1, the blowoff block 25 has a comparatively simple configuration and can be produced easily at reasonable costs. Thus, in this oxygen gas introduction pipe 1, only the blowoff block 25 is replaced for removing the accumulated metal, enabling to remove the accumulated metal at low costs.

By the way, the oxygen gas introduction pipe according to the present invention can be applied other than to the deposition apparatus shown in FIG. 3. For example, it can be applied to a deposition apparatus for depositing a metal thin film on a disc-shaped non-magnetic support body. Moreover, it is possible to arrange a plurality of the oxygen gas introduction pipes 1 for a deposition apparatus, for example, at the up stream side and down stream side of the deposition region indicated by A in FIG. 3.

Moreover, the magnetic recording medium production method according to the present invention employs the aforementioned oxygen gas introduction pipe 1 for blowing off an oxygen gas onto a non-magnetic support body on which a vapor of a magnetic material is to be deposited so as to form a magnetic layer.

Here, as the ferromagnetic metal material serving as the deposition source, there can be exemplified metals such as Fe, Co, Ni, and the like, a Co—Ni alloy, Co—Pt alloy, Co—Pt—Ni alloy, Fe—Co alloy, Fe—Ni alloy, Fe—Co—Ni alloy, Fe—Ni—B alloy, Fe—Co—B alloy, Fe—Co—Ni—B alloy, CO—Cr alloy, and the like.

Moreover, the non-magnetic support body may be made from polyester such as polyethylene terephthalate; polyolefin such as polyethylene and polypropylene; a cellulose derivative such as cellulose triacetate, cellulose diacetate, cellulose acetate butyrate, and the like; vinyl resin such as polyvinyl chloride and polyvinyliden chloride; plastic such as polycarbonate, polyimide, polyamide, polyamideimide, and the like.

In the magnetic recording medium production method according to the present invention which employs the aforementioned oxygen gas introduction pipe 1, it is possible to blow off a uniform oxygen gas quantity in the width direction of a non-magnetic support body. Consequently, the magnetic layer formed has a uniform magnetic characteristic in the width direction of the non-magnetic support body.

Figure 11:
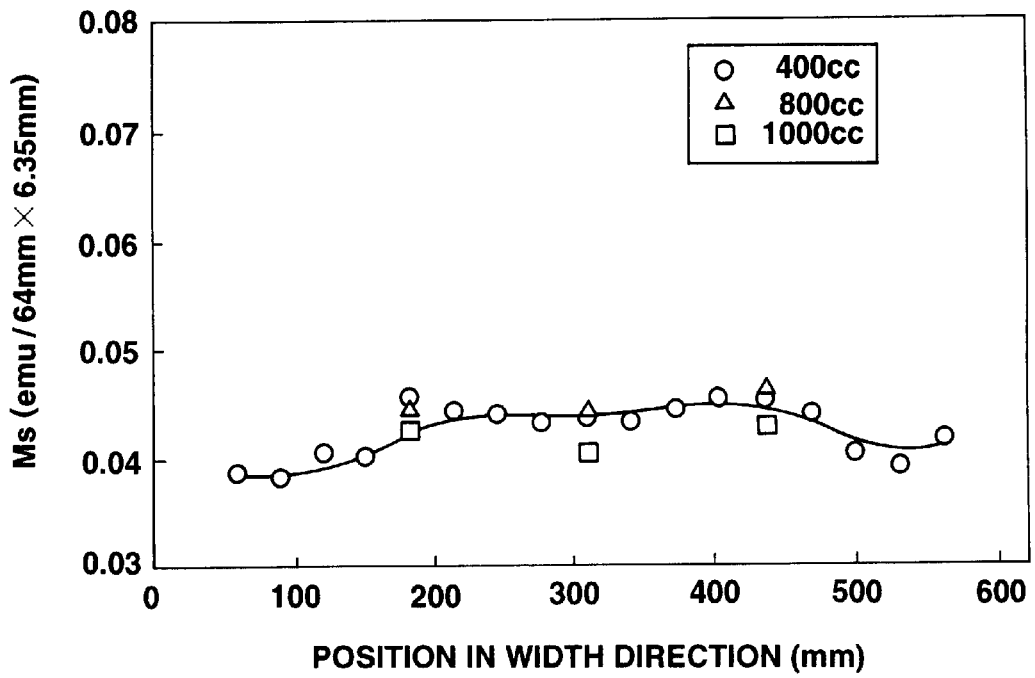
FIG. 11 shows distribution of the saturation magnetization in the width direction of a magnetic recording medium produced by using the magnetic recording medium production method according to the present invention.
Figure 12:
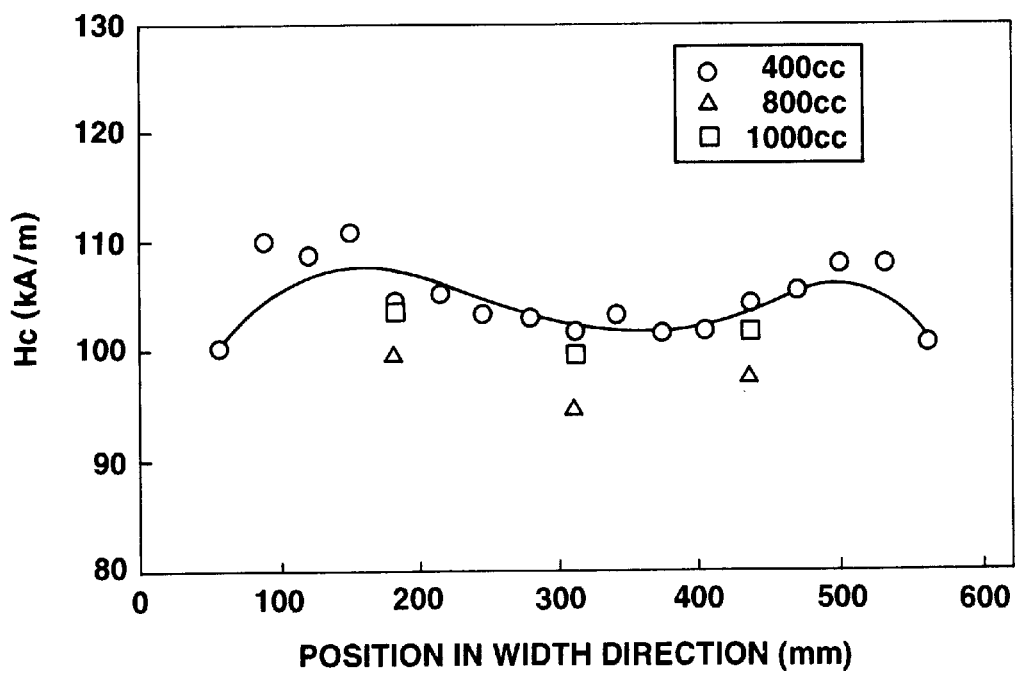
FIG. 12 shows distribution of the coercive force in the width direction of a magnetic recording medium produced by using the magnetic recording medium production method according to the present invention.
Figure 13:
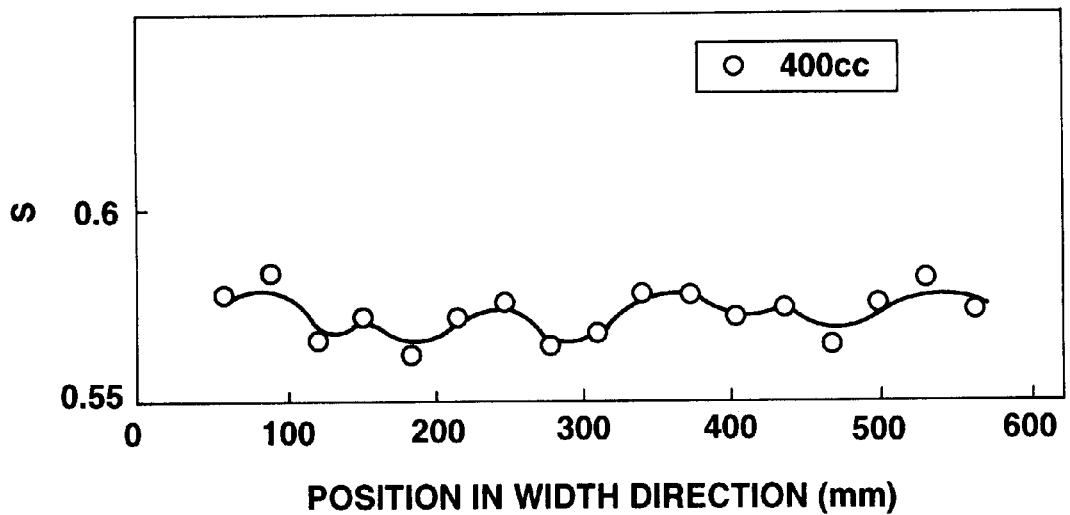
FIG. 13 shows distribution of the rectangular ratio in the width direction of a magnetic recording medium produced by using the magnetic recording medium production method according to the present invention.

The method according to the present invention was actually used to produce a magnetic recording medium and we obtained a magnetic layer having a magnetic characteristic as shown in FIG. 11, FIG. 12, and FIG. 13. Here, the magnetic recording medium was prepared by forming the magnetic layer on an original tape material which was then cut into a desired width of tape. These FIG. 11, FIG. 12, and FIG. 13 show the magnetic characteristic of the magnetic layer formed on the original tape material having a width of about 600 mm. Note that in FIG. 11, FIG. 12, and FIG. 13, the horizontal axis represents a position in a width direction of the original table material. In FIG. 11, the vertical axis shows a distribution of the saturation magnetization (Ms); in FIG. 12, the vertical axis shows distribution of the coercive force (Hc); and in FIG. 13, the vertical axis shows distribution of the rectangular ratio (S).

Moreover, in FIG. 11, FIG. 12, and FIG. 13, the circle shows a case of 400 cc of oxygen gas introduced per unit time; the triangle shows a case of 800 cc of oxygen gas introduced per unit time; and the square shows a case of 1000 cc oxygen gas introduced per unit time.

Figure 1:
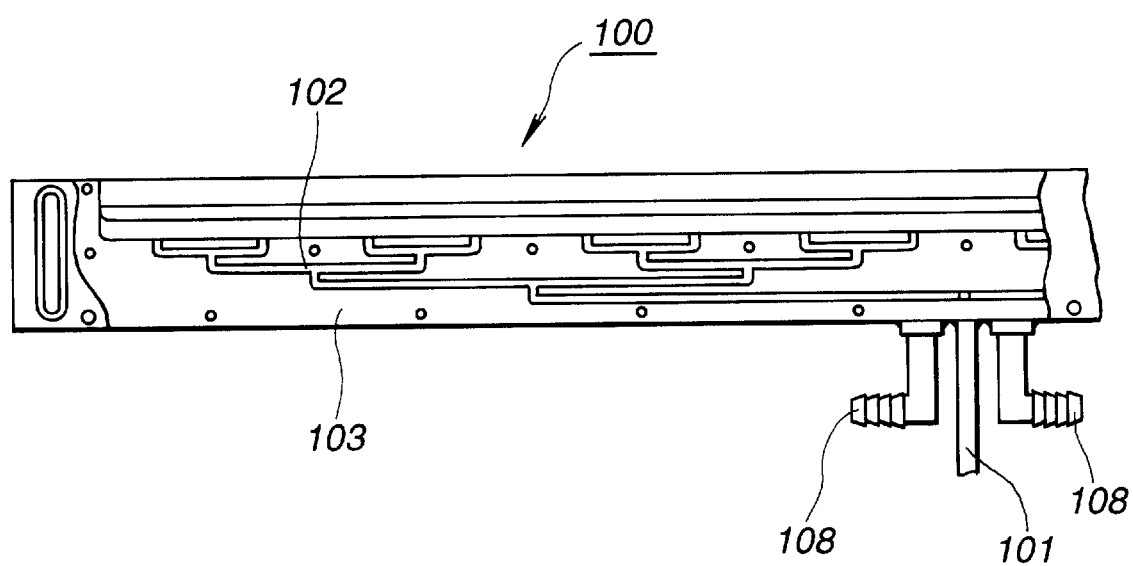
FIG. 1 is a plan view showing an essential portion of a conventional oxygen gas introduction pipe.
Figure 2:
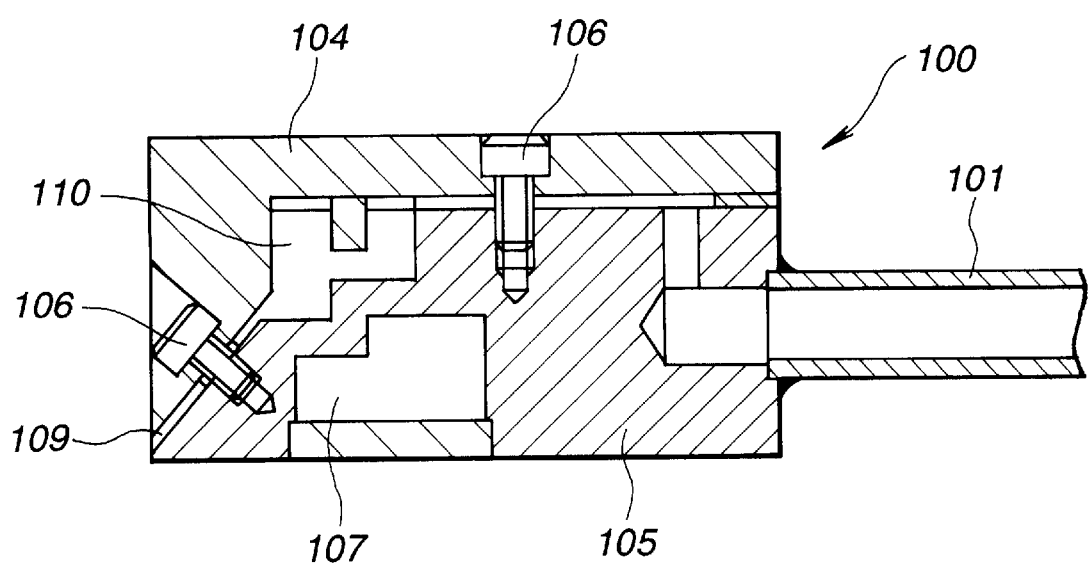
FIG. 2 is a cross sectional view of the conventional oxygen gas introduction pipe.
Figure 14:
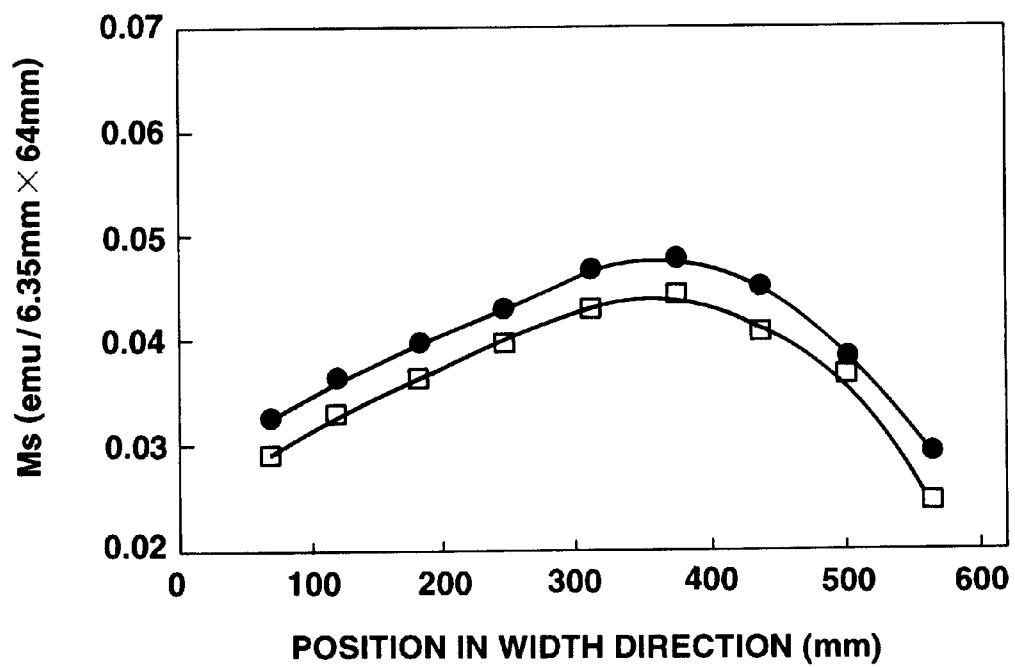
FIG. 14 shows distribution of the saturation magnetization in the width direction of a magnetic recording medium produced by using a conventional oxygen gas introductin pipe.
Figure 15:
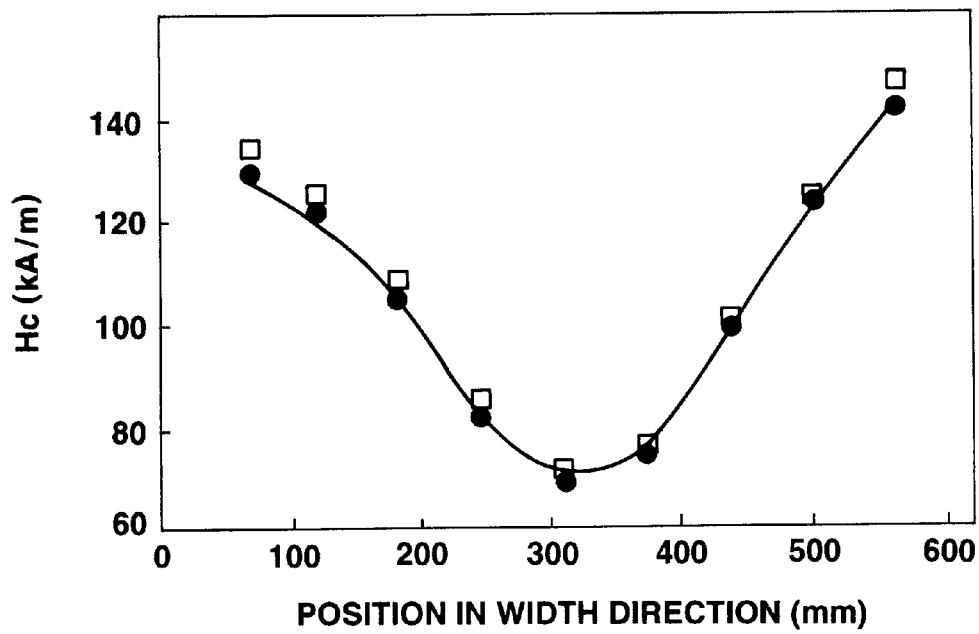
FIG. 15 shows distribution of the coercive force in the width direction of a magnetic recording medium produced by using the conventional oxygen gas introductin pipe.
Figure 16:
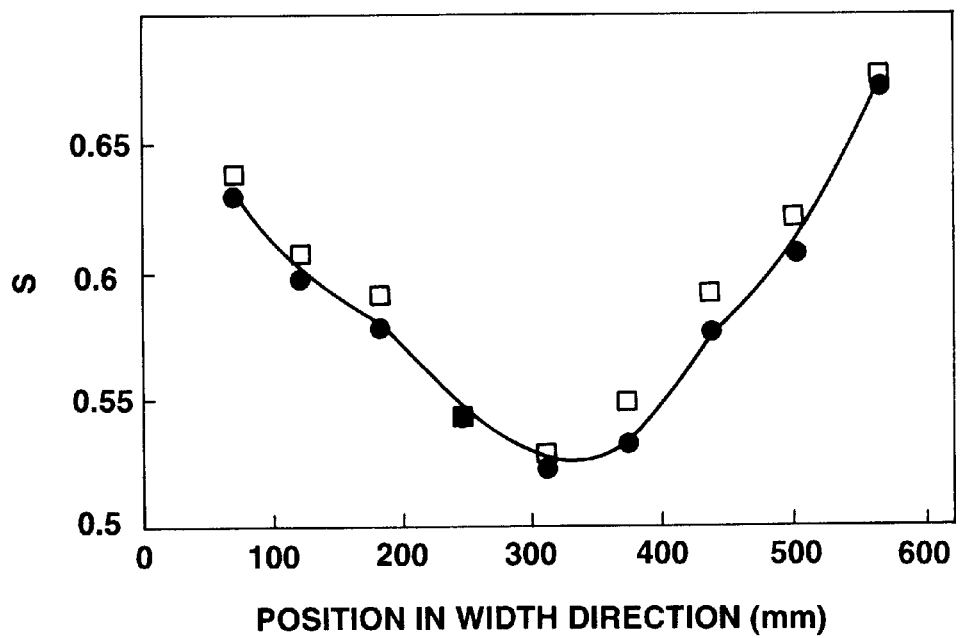
FIG. 16 shows distribution of the rectangular ratio in the width direction of a magnetic recording medium produced by using the conventional oxygen gas introductin pipe.

Moreover, in order compare with the method according to the present invention, a conventional oxygen gas introduction pipe as shown in FIG. 2 was used to produce a magnetic recording medium. In this case also, similarly as in the aforementioned case, we formed a magnetic layer on an original tape material having a width of about 600 mm. FIG. 14, FIG. 15, and FIG. 16 show the magnetic characteristics of the magnetic recording medium thus obtained.

Note that, in these FIG. 14, FIG. 15, and FIG. 16, the horizontal axis represents a position in the width direction of the original tape material. In FIG. 12, the vertical axis shows distribution of the saturation magnetization (Ms); in FIG. 13, the vertical axis shows distribution of coercive force (Hc); and in FIG. 14, the vertical axis shows distribution of rectangular ratio (S).

When the results of FIG. 11, FIG. 12, and FIG. 13 are compared to the results of FIG. 12, FIG. 13, and FIG. 14, it is clear that the magnetic recording medium produced according to the method of the present invention shows a uniform magnetic characteristic in the width direction of the non-magnetic support body. On the contrary, the magnetic recording medium produced by using the conventional oxygen gas introduction pipe does not show a uniform magnetic characteristic in the width direction of the non-magnetic support body.

Thus, according to the conventional method, the magnetic characteristic significantly differs depending on the position on the original tape material and accordingly, the tape-shaped magnetic recording medium prepared by cutting the original tape material also shows great irregularities in the magnetic characteristic. In contrast to this, the method according to the present invention enables to form a magnetic layer having an almost uniform magnetic characteristic over the original tape material and accordingly, the tape-shaped magnetic recording medium prepared by cutting the original tape material also shows an almost uniform magnetic characteristic.

The method of the present invention has been described through an example of forming a metal magnetic thin film, but this method is not to be limited to formation, i.e., deposition of a metal magnetic thin film. By introducing a particular gas for deposition, it is possible to obtain various types of deposition film with a uniform gas introduction.

As is clear from the aforementioned, in the gas introduction pipe according to the present invention, replacement of only the blowoff block enables to replace the blowoff opening. Consequently, this gas introduction pipe enables to replace the blowoff opening at low costs.

Moreover, the magnetic recording medium production method according to the present invention employs the aforementioned gas introduction pipe and accordingly, it is possible to obtain a magnetic layer having highly uniform magnetic characteristics. Consequently, according to the method of the present invention, it is possible to produce a magnetic recording medium exhibiting a preferable electro-magentic conversion characteristic.

What is claimed is:

1. A gas introduction pipe comprising:
   a gas supply pipe for supplying a gas;
   a main body connected to said gas supply pipe and having a gas flow passage for flowing of a gas supplied from said gas supply pipe; and
   a blowoff block arranged at the opposite side of said main body not having said gas supply pipe and having a blowoff opening exposed outward for blowing off the gas outside,
   wherein said blowoff block can be detached and attached from/to said main body and wherein said blowoff block includes an upper blowoff opening forming portion, a lower blowoff opening forming portion, and a plurality of connecting pins inserted with a pressure into said upper blowoff opening forming portion and said lower blowoff opening forming portion, so as to be made into a unitary block.

2. A gas introduction pipe as claimed in claim 1, wherein said main body and said blowoff block are made from materials having an identical thermal expansion coefficient.

3. A gas introduction pipe as claimed in claim 1, wherein said connecting pins have spacer members to be sandwiched between said upper blowoff opening forming portion and said lower blowoff opening forming portion, and are arranged almost at an identical interval in the width direction of said blowoff opening.

4. A gas introduction pipe as claimed in claim 1, wherein said blowoff block is held by being sandwiched by said main body.

* * * * *